United States Patent
Matsuda et al.

(10) Patent No.: US 7,416,793 B2
(45) Date of Patent: Aug. 26, 2008

(54) ELECTROSTATIC CHUCK AND MANUFACTURING METHOD FOR THE SAME, AND ALUMINA SINTERED MEMBER AND MANUFACTURING METHOD FOR THE SAME

(75) Inventors: Hiroto Matsuda, Ogaki (JP); Kazuhiro Nobori, Handa (JP); Yasuyoshi Imai, Nagoya (JP); Tetsuya Kawajiri, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 378 days.

(21) Appl. No.: 11/021,742

(22) Filed: Dec. 23, 2004

(65) Prior Publication Data
US 2005/0152089 A1 Jul. 14, 2005

(30) Foreign Application Priority Data
Dec. 26, 2003 (JP) ............ P2003-435205
Nov. 24, 2004 (JP) ............ P2004-339252

(51) Int. Cl.
*B32B 9/00* (2006.01)
(52) U.S. Cl. ............ 428/701; 219/444.1; 279/128; 361/234; 501/127; 501/153; 428/702
(58) Field of Classification Search ............ 219/444.1; 279/128; 361/234; 428/701, 702; 501/127, 501/153
See application file for complete search history.

(56) References Cited

U.S. PATENT DOCUMENTS

| 3,871,891 | A | * | 3/1975 | Schuller et al. ............ 501/127 |
| 2001/0043452 | A1 | | 11/2001 | Divakar et al. |
| 2003/0123213 | A1 | * | 7/2003 | Kosakai ............ 361/234 |

FOREIGN PATENT DOCUMENTS

| JP | 03-204924 A1 | 9/1991 |
| JP | 09-283607 A1 | 10/1997 |
| JP | 2003-037158 | 2/2003 |
| JP | 2003-152065 A1 | 5/2003 |

* cited by examiner

*Primary Examiner*—John J. Zimmerman
*Assistant Examiner*—Aaron Austin
(74) *Attorney, Agent, or Firm*—Burr & Brown

(57) ABSTRACT

An electrostatic chuck comprises a dielectric ceramic layer made of an alumina sintered body having a volume resistivity equal to or greater than about $1\times10^{17}$ Ω·cm at room temperature and a volume resistivity equal to or greater than about $1\times10^{14}$ Ω·cm at 300° C., and an electrode formed on one surface of the dielectric ceramic layer.

22 Claims, 5 Drawing Sheets

ELECTROSTATIC CHUCK AND MANUFACTURING METHOD FOR THE SAME, AND ALUMINA SINTERED MEMBER AND MANUFACTURING METHOD FOR THE SAME

CROSS REFERENCE TO RELATED APPLICATIONS

This application is based upon and claims the benefit of priority from prior Japanese Patent Applications No.P2003-435205, filed on Dec. 26, 2003 and No.P2004-339252, filed on Nov. 24, 2004; the entire contents of which are incorporated herein by reference.

BACKGROUND OF THE INVENTION

1. Field of the Invention

The present invention relates to an electrostatic chuck and a manufacturing method for the same, and an alumina sintered member and a manufacturing method for the same.

2. Description of the Related Art

An electrostatic chuck is utilized to hold a glass substrate or silicon wafer during a semiconductor manufacturing process or a liquid crystal display manufacturing process. The electrostatic chuck holds a substrate using the electrostatic force and generally has a structure with a dielectric layer stacked on an electrode. After a substrate is mounted on a dielectric layer, the electrostatic chuck holds the substrate on the dielectric layer using the electrostatic force called Coulomb force, which is generated between the substrate and the electrode. Alternatively, the electrostatic chuck holds a substrate on a dielectric layer using the electrostatic force called Johnsen-Rahbek force (hereafter, called 'J-R force'), which is generated between the substrate and the surface of the dielectric layer.

The electrostatic chuck using Coulomb force (hereafter, called a Coulomb-type electrostatic chuck) uses as a dielectric layer a highly insulating material having a volume resistivity equal to or greater than $^{14}\Omega\cdot cm$ in an operating temperature. The electrostatic chuck using the J-R force (hereafter, called a J-R type electrostatic chuck) uses as a dielectric layer a material having a volume resistivity equal to or less than $10^{14}\Omega\cdot cm$ in an operating temperature.

Resin such as polyimide resin, and a ceramic material such as aluminum nitride (AlN) or alumina ($Al_2O_3$) are well known to be used as a material for the dielectric layer. The electrostatic chuck using resin such as polyimide resin is inexpensive, however, the corrosion resistance and heat-resistance thereof are limited. For example, in a high temperature range of 100° C. or greater, usage thereof is difficult. On the other hand, the electrostatic chuck using a ceramic material such as aluminum nitride or alumina has better characteristics in corrosion resistance and heat-resistance.

Precisely, the aluminum nitride cannot have very high volume resistivity, which limits allowable operating temperature range when using that aluminum nitride as the Coulomb-type electrostatic chuck. Therefore, that aluminum nitride is often used for the J-R type electrostatic chuck.

A dielectric alumina layer formed by spraying so as to decrease the process cost is well known. Alumina provided by plasma-spraying has a volume resistivity equal to or less than $^{14}\Omega\cdot cm$ at a temperature of 20° C., for example, which is not very high in resistance. To solve this problem, an electrostatic chuck with an adjusted volume resistivity ranging between $10^9$ and $10^{11}\Omega\cdot cm$ at a temperature of 100° C. or less, which is provided by adding an additive such as $TiO_2$ to alumina, has been proposed (see Japanese Patent Application Laid-open Hei 3-204924.) Moreover, an electrostatic chuck with volume resistivity ranging between $10^8$ and $10^{15}\Omega\cdot cm$ at room temperature, which is provided by adding SiC to alumina so as to improve corrosion resistance and strength, has been proposed (see Japanese Patent 3348140.)

Furthermore, an electrostatic chuck using sintered alumina with an adjusted volume resistivity ranging between $10^{14}$ and $10^{16}\Omega\cdot cm$ at a temperature of 200° C. or less has been proposed (see Japanese Patent Application Laid-open 2003-152065.) As disclosed therein, the conventional electrostatic chuck using alumina as a dielectric layer uses an additive added dielectric alumina layer, in order to reduce a volume resistivity and enhance strength and corrosion resistance. Even with the electrostatic chuck using comparatively high volume resistivity, the volume resistivity of the dielectric alumina layer is $10^{16}\Omega\cdot cm$ or less.

However, an aluminum nitride has comparatively high volume resistivity and semiconductor characteristics. Therefore, the electrostatic chuck using an aluminum nitride of the ceramic materials as a dielectric layer cannot maintain a high chucking force in the range from a low to a high temperature, since the resistance strongly depends on temperature. In addition, it is difficult to control leakage current.

Thus, the J-R type electrostatic chuck using an aluminum nitride with comparatively low resistance as a dielectric layer cannot avoid leakage current. On the other hand, the Coulomb-type electrostatic chuck has little leakage current, however, residual charge tends to remain on the surface of the electrostatic chuck. This leads to a problem of poor substrate dechucking response when the volume resistivity of the dielectric layer is not high.

Moreover, a conventional electrostatic chuck using alumina with comparatively high resistance added an additive causes wafer contamination and leakage current. Also, with the electrostatic chuck using alumina with comparatively high resistance as a dielectric layer, the volume resistivity reduces as temperature rises. Consequently, the substrate dechucking response gets worse. In other words, the conventional chuck can be used only within a narrow temperature range. Moreover, an alumina member is not provided to maintain excellent electrical insulation over a wide temperature range.

SUMMARY OF THE INVENTION

An object of the present invention is to provide an electrostatic chuck, which has a stabilized chucking force over a wide temperature range, a good dechucking response, and less leakage current flowing to a substrate, an alumina sintered member, which maintains excellent electrical isolation over a wide temperature range, and a manufacturing method for them.

An electrostatic chuck, according to an embodiment of the present invention, comprises a dielectric ceramic layer made of an alumina sintered body having a volume resistivity equal to or greater than about $1\times10^{17}\Omega\cdot cm$ at room temperature and a volume resistivity equal to or greater than about $1\times10^{14}\Omega\cdot cm$ at 300° C., and an electrode formed on one surface of the dielectric ceramic layer.

An electrostatic chuck, according to an embodiment of the present invention, comprises a dielectric ceramic layer made of an alumina sintered body having a volume equal to or greater than about $1\times10^{17}\Omega\cdot cm$ at room temperature and a volume resistivity equal to or greater than about $1\times10^{15}\Omega\cdot cm$ at 200° C.; and an electrode formed on one surface of the dielectric ceramic layer.

According to these electrostatic chucks, as compared to the conventional alumina sintered bodies, a dielectric ceramic layer may be made of an alumina sintered body having an extremely high volume resistivity over a wide temperature range. This allows Coulomb-type electrostatic chucks to provide stabilized chucking forces over a wide temperature range. Moreover, those electrostatic chucks allow reduction in leakage current flowing from them to respective substrates. Furthermore, those electrostatic chucks can provide a high response speed when dechucking the substrate, i.e., a good dechucking response, since charge hardly exists in the dielectric ceramic layer.

A manufacturing method for an electrostatic chuck, according to an embodiment of the present invention, comprises forming an alumina sintered body by sintering with ceramic raw material powder including at least about 99.5% by weight alumina in an inert atmosphere or a reduction atmosphere by a hot press method; and forming an electrode.

According to such a manufacturing method for an electrostatic chuck, as compared to the conventional alumina sintered bodies, a high-purity alumina sintered body having an extremely high volume resistivity over a wide temperature range can be provided. Also, a Coulomb-type electrostatic chuck in which this alumina sintered body is used as a dielectric ceramic layer can be provided. Therefore, according to such a manufacturing method, a stabilized chucking force can be provided over a wide temperature range, and leakage current flowing from the electrostatic chuck to a substrate can be reduced, and a good dechucking response can be provided. Moreover, according to such a manufacturing method, since the purity of the dielectric ceramic layer can be improved, an electrostatic chuck that cannot be a contamination source to the substrate can be provided.

According to a manufacturing method for an electrostatic chuck according to the present invention, the order of the above-mentioned steps is not limited. For example, an alumina compact is formed with the ceramic raw material powder, and an electrode is then formed on one surface of the alumina compact; afterwards, the alumina compact and the electrode are sintered together. Alternatively, first, an alumina compact in which an electrode is buried may be formed with the ceramic raw material powder, and then the alumina compact and the electrode may be sintered together. Further alternatively, after sintering an alumina compact formed with the ceramic raw material powder, an electrode may be formed on one surface of the sintered body.

An alumina sintered member, according an embodiment of the present invention, has a volume resistivity equal to or greater than about $1\times10^{17}\Omega\cdot cm$ at room temperature and a volume resistivity equal to or greater than about $1\times10^{14}\Omega\cdot cm$ at 300° C.

An alumina sintered member, according to an embodiment of the present invention, has a volume resistivity equal to or greater than about $1\times10^{17}\Omega\cdot cm$ at room temperature and a volume resistivity equal to or greater than about $1\times10^{15}\Omega\cdot cm$ at 200° C.

According to these alumina sintered members, excellent electrical insulation can be maintained over a wide temperature range. This allows those alumina sintered members to be used for a variety of applications that require excellent electrical insulation over a wide temperature range.

A manufacturing method for an alumina sintered member, according to an embodiment of the present invention, comprises forming an alumina sintered member having a volume resistivity equal to or greater than about $1\times10^{17}\Omega\cdot cm$ at room temperature and a volume resistivity equal to or greater than about $1\times10^{14}\Omega\cdot cm$ at 300° C. by sintering with ceramic raw material powder including at least about 99.5% by weight alumina in an inert atmosphere or a reduction atmosphere by a hot press method.

A manufacturing method for an alumina sintered member, according to an embodiment of the present invention, comprises forming an alumina sintered member having a volume resistivity equal to or greater than about $1\times10^{17}\Omega\cdot cm$ at room temperature and a volume resistivity equal to or greater than about $1\times10^{15}\Omega\cdot cm$ or greater at 200° C. by sintering with ceramic raw material powder including at least about 99.5% by weight alumina in an inert atmosphere or a reduction atmosphere by a hot press method.

According to these manufacturing methods for alumina sintered members, a high-purity alumina sintered member having an extremely high volume resistivity over a wide temperature range can be provided. Therefore, according to such manufacturing methods, excellent electrical insulation can be maintained over a wide temperature range, and an alumina sintered member providing no fear that it may be a contamination source can be provided.

DETAILED DESCRIPTION OF THE INVENTION

An electrostatic chuck and a manufacturing method for the same, and a aluminum sintered member and a manufacturing method for the same, according to an embodiment of the present invention, are explained by referencing drawings.

(Electrostatic chuck)

Figure 1A:
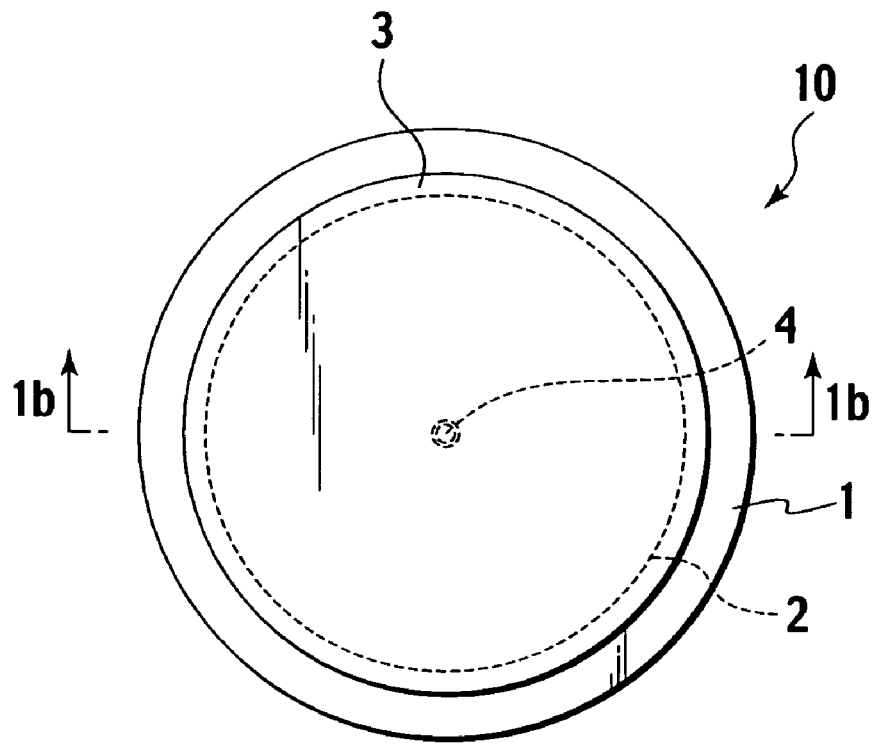
FIGS. 1A and 1B show a plan view and a sectional view taken along line 1b-1b of a single electrode electrostatic chuck, according to an embodiment of the present invention.
Figure 1B:
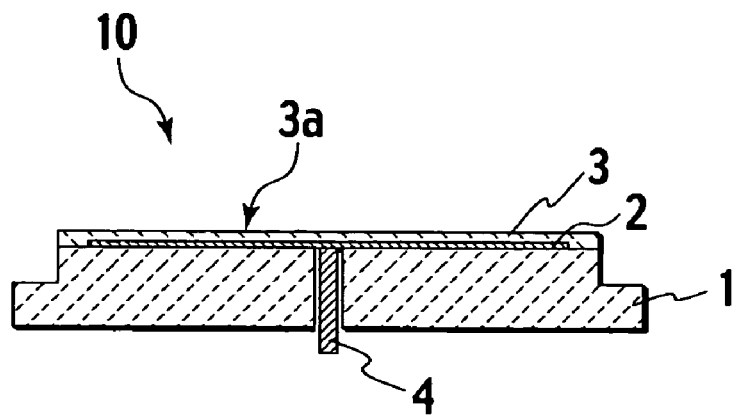

FIG. 1A and 1B are a plan view and a sectional view of an electrostatic chuck 10, according to the embodiment of the present invention. The electrostatic chuck 10 includes a dielectric ceramic layer 3, an electrode 2 formed on one surface of the dielectric ceramic layer 3, a ceramic substrate 1 joined to the dielectric ceramic layer 3 via the electrode 2, and an electrode terminal 4. The electrode 2 and the dielectric ceramic layer 3 are arranged on the ceramic substrate 1, and the electrode 2 is buried between the ceramic substrate 1 and the dielectric ceramic layer 3.

The surface of the dielectric ceramic layer 3 is a substrate contact surface 3a, and a substrate such as a silicon wafer or a glass substrate is mounted and chucked on the substrate contact surface 3a. The ceramic substrate 1 and the dielectric ceramic layer 3 are disc-shaped as shown in FIGS. 1A and 1B. The electrostatic chuck 10 is a single electrode type having a single electrode 2.

The electrostatic chuck 10 is a Coulomb-type having the dielectric ceramic layer 3 made of an alumina sintered body having an extremely high volume resistivity over a wide temperature range. A more detailed structure of the electrostatic chuck is explained below.

The dielectric ceramic layer 3 is made of an alumina sintered body having a volume resistivity equal to or greater than about $1\times10^{17}\Omega\cdot$cm at room temperature and a volume resistivity equal to or greater than about $1\times10^{14}\Omega\cdot$cm at 300° C.

Alternatively, the dielectric ceramic layer 3 may be made of an alumina sintered body having a volume resistivity equal to or greater than about $1\times10^{17}\Omega\cdot$cm at room temperature and a volume resistivity equal to or greater than about $1\times10^{15}\Omega\cdot$cm at 200° C.

In this way, the dielectric ceramic layer 3 has an extremely high volume resistivity over a wide temperature range, allowing the Coulomb-type electrostatic chuck to provide a high chucking force over a wide temperature range. The Coulomb-type electrostatic chuck generates a chucking force (F) between the electrode 2 and the substrate mounted on the dielectric ceramic layer 3, which is represented by the following Equation (1). Consequently, the substrate is chucked due to the chucking force (F).

$$F=(\tfrac{1}{2})\epsilon^2\epsilon_0(V/d)^2 \quad (1)$$

In Equation (1), $\epsilon$ denotes a dielectric constant for the dielectric ceramic layer 3; $\epsilon_0$ denotes a electric constant; V denotes an applied voltage to the electrode 2; and d denotes a distance between the electrode 2 and the substrate, i.e., the thickness of the dielectric ceramic layer 3.

Since the dielectric ceramic layer 3 maintains a high volume resistivity over a wide temperature range, the dielectric constant $\epsilon$ in the Equation (1) can be a high value. Therefore, the electrostatic chuck 10 is capable of maintaining a high chucking force (F) over the range from room temperature to 200° C. or 300° C. Moreover, since such dielectric ceramic layer 3 is capable of maintaining a high volume resistivity at room temperature or less, a high chucking force can be kept over a very wide temperature range.

In addition, since the electrostatic chuck 10 is capable of maintaining a high volume resistivity over a wide temperature range, leakage current flowing from the electrostatic chuck to the substrate can be reduced or almost completely prevented. Therefore, the electrostatic chuck 10 can be used for the next generation of semiconductor processes in which a minute leakage current influences the device characteristics.

Moreover, since charge hardly exists in the dielectric ceramic layer 3, the electrostatic chuck 10 can provide the high response speed for dechucking a substrate, i.e., an excellent dechucking response. Of the conventional Coulomb-type electrostatic chucks, there are those using dielectric layer material with comparatively a high volume resistivity of approximately from $1\times10^{14}$ to $1\times10^{16}\Omega\cdot$cm at room temperature. However, even with such electrostatic chucks, the volume resistivities reduce as temperature rises. This allows residual charge to remain in the dielectric layer even after application of a voltage on the electrode is stopped, and thus the chucking force is maintained. Therefore, dechucking the substrate requires removal of the residual charge to the outside of the dielectric layer, and a certain time for removal before dechucking the substrate is needed.

In other words, since a dielectric layer with comparatively a low volume resistivity equal to or less than $1\times10^{12}\Omega\cdot$cm used for the J-R type electrostatic chuck allows residual charge in the dielectric layer to quickly flow, the dechucking time is comparatively short. However, according to the dielectric layer with comparatively high volume resistivity of approximately from $1\times10^{12}$ to $1\times10^{14}\Omega\cdot$cm, since moving of residual charge in the electric layer after stoppage of voltage application to either the substrate side or the electrode side takes a lot of time, the substrate dechucking response is poor.

Since the alumina sintered body having an extremely high volume resistivity equal to or greater than about $10^{17}\Omega\cdot$cm is used as the dielectric ceramic layer 3, the substrate and the electrode 2 are completely polarized, and thus charge flowing through the dielectric ceramic layer 3 barely exists. Therefore, deterioration of the dechucking response due to residual charge remains after stoppage of voltage application flowing through the dielectric ceramic layer 3 can be prevented. More specifically, if the volume resistivity of the dielectric ceramic layer 3 is equal to or greater about $1\times10^{17}\Omega\cdot$cm, dechucking the substrate at almost the same time as voltage application stops is possible; and if it is equal to or greater than about $1\times10^{14}\Omega\cdot$cm, dechucking the substrate within five or six seconds after stoppage of voltage application is possible. This means that the electrostatic chuck 10 provides a very high response speed for dechucking the substrate and an excellent dechucking response.

In addition, it is preferable that the alumina sintered body forming the dielectric ceramic layer 3 having a volume resistivity equal to or greater than about $1\times10^{14}\Omega\cdot$cm at 300° C. has a volume resistivity equal to or greater than about $1\times10^{14}\Omega\cdot$cm at 400° C. According to this, the electrostatic chuck 10 is capable of maintaining an excellent chucking force over a wider temperature range, more specifically, over a temperature range from room temperature or less to 400° C., and leakage current is decreased, providing an excellent dechucking response.

Moreover, it is preferable that the alumina sintered body forming the dielectric ceramic layer 3 has a volume resistivity equal to or greater than about $1\times10^{15}\Omega\cdot$cm at 300° C. Furthermore, it is preferable that the alumina sintered body forming the dielectric ceramic layer 3 has a volume resistivity equal to or greater than about $1\times10^{15}\Omega\cdot$cm at 200° C. According to this, the electrostatic chuck 10 is capable of enhancing the dechucking response.

The thinner the thickness d of the dielectric ceramic layer 3, the better. More specifically, it is preferable that the dielectric ceramic layer 3 has a thickness in a range from about 0.05 mm to about 0.50 mm; and it is further preferable that the dielectric ceramic layer 3 has a thickness in a range from about 0.05 mm to about 0.40 mm. According to this, the electrostatic chuck 10 is capable of providing a stronger electrostatic force (Coulomb's force) between the electrode 2 and the substrate mounted on the dielectric ceramic layer 3, thereby providing a strong chucking force.

The manufacturing method for the dielectric ceramic layer 3 made of alumina sintered body is not specifically limited, however, it is preferable to use a hot press method for sintering thereof. According to this, as compared to the alumina sintered body, which is provided by sintering in the atmosphere or in an inert atmosphere by conventional atmospheric sintering method, a high volume resistivity can be provided. In particular, it is preferable that the alumina sintered body is sintered in a reduction atmosphere or in an inert atmosphere by a hot press method.

According to this, the alumina sintered body can be surely provided having characteristics of a volume resistivity equal to or greater than about $1\times10^{17}\Omega\cdot$cm at room temperature and a volume resistivity equal to or greater than about $1\times10^{14}$ $\Omega\cdot$cm at 300° C., or characteristics of a volume resistivity equal to or greater than $1\times10^{17}$ 106 ·cm at room temperature and a volume resistivity equal to or greater than about $1\times10^{15}\Omega\cdot$cm at 200° C. Therefore, the electrostatic chuck 10 is capable of having the dielectric ceramic layer 3 made of an alumina sintered body with a high volume resistivity, which is pressurized to be high density by a hot press method.

The inert gas is nitrogen or argon, for example. The inert atmosphere may be generated by introducing nitride or argon in a decompressed atmosphere. Sintering may be carried out multiple times (e.g., two times), and sintering by a hot press method is carried out at least a single time, for example, at the final sintering (the second time) stage in a reduction atmosphere or in an inert atmosphere. This surely allows provision of the aforementioned volume resistivity. In this manner, sintering in a reduction atmosphere or an inert atmosphere by a hot press method should be carried out at least once. In the case of sintering multiple times, easier manufacture is provided by sintering only once by a hot press method and then by an atmospheric sintering method.

The volume resistivity of the alumina sintered body depends on multiple factors such as a purity (concentration of impurity), crystallinity, density, state of grain boundary or the like. Therefore, the volume resistivity of the alumina sintered body can be adjusted by adjusting these factors.

The purity of the alumina sintered body forming the dielectric ceramic layer 3 is preferably equal to or greater than about 99.5% by weight, and the density thereof is preferably in a range from about 3.80 to about 4.00 g/cm$^3$. According to this, the electrostatic chuck 10 has a high volume resistivity over a wide temperature range, has no possibility of being a contamination source, and is capable of having the dielectric ceramic layer 3 with excellent corrosion resistance.

More specifically, the substrate contact surface 3a of the dielectric ceramic layer 3 is in direct contact with the substrate, however, the purity of the alumina sintered body is equal to or greater than 99.5% by weight, which is high, and concentration of an additive to possibly be a source of contaminating a silicon wafer or a glass substrate or the like is controlled to be low. Due to this, the electrostatic chuck 10 can prevent contamination of the substrate. As a result, the electrostatic chuck 10 can prevent contamination of semiconductor devices manufactured from the substrate even when the substrate is directly mounted on the dielectric ceramic layer 3. Moreover, since the dielectric ceramic layer 3 has a high density in a range from about 3.80 to about 4.00 g/cm$^3$, the electrostatic chuck 10 can have excellent corrosion resistance. A further preferable purity of the alumina sintered body is equal to or greater than about 99.7% by weight, and further preferable density of the alumina sintered body is in a range from about 3.93 to about 4.00 g/cm$^3$.

Moreover, it is preferable that the bending strength (JIS R1601) of the alumina sintered body forming the dielectric ceramic layer 3 is equal to or greater than about 350 MPa. According to this, the alumina sintered body hardly occurs any breakage such as cracks when being processed such as being drilled. In addition, since the electrostatic chuck 10 forming such an alumina sintered body hardly chips even when in use, generation of particles can be prevented and durability can be improved. Further preferable bending strength is equal to or greater than about 365 MPa.

It is preferable that surface roughness (Ra) (JIS B0601) of the dielectric ceramic layer 3 is equal to or less than about 0.5 μm. According to this, when flowing a backside gas between the back side of the substrate and the substrate contact surface 3a of the dielectric ceramic layer 3, turbulent of the backside gas flow is prevented, making the substrate temperature uniform. It is preferable that the surface roughness (Ra) of the dielectric ceramic layer 3 is low, however, it is further preferably in a range from about 0.1 to about 0.5 μm which allows reduction of processing cost.

Moreover, it is preferable that the open porosity of the alumina sintered body forming the dielectric ceramic layer 3 is about 0%. According to this, a high withstand voltage may be provided. Furthermore, it is preferable that the maximum pore diameter of the alumina sintered body forming the dielectric ceramic layer 3 is equal to less than about 100 μm. According to this, a high withstand voltage may be provided. It is preferable that the maximum pore diameter is equal to or less than about 50 μm. It is preferable that the withstand voltage for the alumina sintered body forming the dielectric ceramic layer 3 is equal to or greater than about 15 kV/mm. It is further preferable that the withstand voltage is equal to or greater than about 18 kV/mm.

It is preferable that the diameter of the dielectric ceramic layer 3 is shorter than that of the substrate mounted on the substrate contact surface 3a. According to this, the substrate can cover the dielectric ceramic layer 3 when the substrate is mounted, preventing exposure of the dielectric ceramic layer 3. This prevents scattering of the constituents of the dielectric ceramic layer 3 due to a plasma bombardment when using the electrostatic chuck 10 in a plasmatic environment such as in a dry-etching apparatus and the resulting contamination of the substrate. Note that the shape of the dielectric ceramic layer 3 is not specifically limited, and may have a wider substrate contact surface 3a than the substrate in accordance with a use environment.

A voltage is applied to the electrode 2, which then generates an electrostatic force (Coulomb's force). The electrode 2 may be made of a high melting point material such as molybdenum (Mo), tungsten (W), WC or the like, and the form thereof is not particularly limited. The electrode 2 may be a planar electrode. The electrode 2 may be for example, a printed electrode, which is formed by printing, drying, and sintering a printing paste including metallic powder, or a filmy electrode such as a metallic film, which is formed by physical vapor deposition such as sputtering or ion beam deposition, or chemical deposition such as CVD. The metallic film may be a specifically shaped electrode (a patterned electrode) by etching. The electrode 2 may be a bulk metal such as a mesh metallic electrode (mesh electrode), a punching metal or a metallic plate.

Note that it is preferable to use a printing paste obtained by mixing alumina powder, or ceramic powder, which is used for the ceramic substrate 1, and metallic powder so that a printed electrode can have a similar thermal expansion coefficient to that of the dielectric ceramic layer 3 or the ceramic substrate 1.

As shown in FIGS. 1A and 1B, it is preferable that the electrode 2 is completely buried in the entirety of the ceramic substrate 1 and the dielectric ceramic layer 3 joined together, thereby never being exposed. According to this, even in the case of using the electrostatic chuck 10 in a corrosive gas atmosphere, corrosion resistance can be improved. An electrode terminal 4 to which a voltage is applied is connected to the electrode 2 by brazing.

The ceramic substrate 1 is made of sintered ceramics supporting the electrode 2 and the dielectric ceramic layer 3. As long as the ceramic substrate 1 is made of the sintered ceramics, type thereof is not limited; however, it is preferable to be made of an alumina sintered body. According to this, since the dielectric ceramic layer 3 and the ceramic substrate 1 are made of the same material, there is a near-zero thermal expansion coefficient difference between the dielectric ceramic layer 3 and the ceramic substrate 1, which allows prevention of thermal stress generation due to a thermal expansion coefficient difference existing at the junction therebetween.

It is preferable that the ceramic substrate 1 is made of an alumina sintered body having a purity equal to or greater than about 99% by weight. According to this, the ceramic substrate 1 may have excellent insulating properties, excellent heat resistance, and excellent corrosion resistance. Note that the volume resistivity as high as the alumina sintered body forming the dielectric ceramic layer 3 is not needed for the ceramic substrate 1. The ceramic substrate 1 may be made of an aluminum nitride (AlN) sintered body, a silicon nitride ($Si_3N_4$) sintered body, a silicon carbide (SiC) sintered body, a spinel ($MgAl_2O_4$) sintered body or the like other than the alumina sintered body. Alternatively, other than ceramics, a metallic material, a composite material of ceramics and a metal may be used for the substrate.

It is preferable that the dielectric ceramic layer 3, the electrode 2, and the ceramic substrate 1 are an integrated sintered body by a hot press method. The structure of the electrostatic chuck 10 sintered into an integrated body by a hot press method allows the ceramic substrate 1 and the dielectric ceramic layer 3 to be joined to each other without generation of a gap therebetween without using an adhesive layer or the like on the joint surface therebetween. In other words, an integrated electrostatic chuck 10 can be provided without leaving hardly any joint interface. This allows improvement of the corrosion resistance. In other words, since the buried electrode 2 can be completely shutoff from the external atmosphere, the electrostatic chuck 10 can maintain excellent corrosion resistance for use in a corrosive gas atmosphere.

Figure 2A:
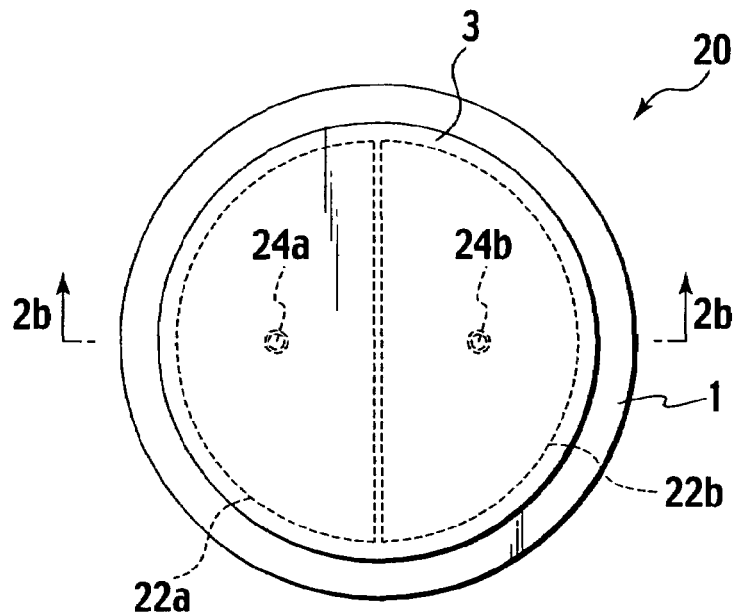
FIGS. 2A and 2B show a plan view and a sectional view taken along line 2b-2b of bipolar electrostatic chuck, according to an embodiment of the present invention.
Figure 2B:
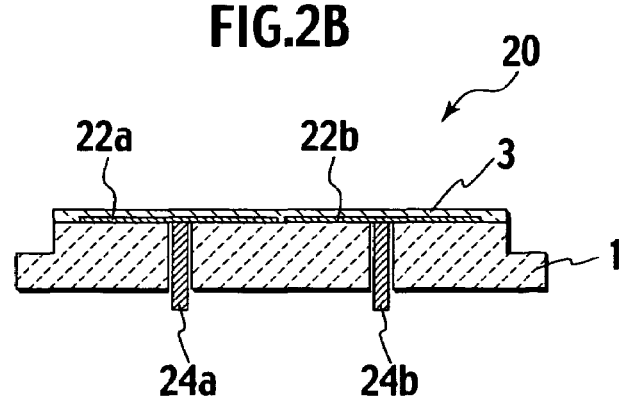

The electrostatic chuck may be a bipolar electrostatic chuck 20 having two electrodes as shown in FIGS. 2A and 2B other than the single electrode electrostatic chuck 10 shown in FIGS. 1A and 1B. FIGS. 2A and 2B show an plan view (FIG. 2A) and a sectional view (FIG. 2B), respectively, of the structure of the electrostatic chuck 20. The electrostatic chuck 20 comprises a ceramic substrate 1, two electrodes 22a and 22b, a dielectric ceramic layer 3, and two electrode terminals 24a and 24b.

With the electrostatic chuck 20, a planar electrode buried between the ceramic substrate 1 and the dielectric ceramic layer 3 is divided into two parts. How to divide the electrode is not limited. The electrode may be divided into two semicircles, two comb shapes, or two rings, for example. The electrostatic chuck 20 may use a semicircle shape, a comb shape, or a ring shape shown in FIGS. 2A and 2B as the electrodes 22a and 22b. Moreover, the electrode may be divided into more than two electrodes. In the electrostatic chuck 20, the electrode terminals 24a and 24b are connected to the electrodes 22a and 22b, respectively, by brazing. Otherwise, the electrostatic chuck 20 is the same as the electrostatic chuck 10 shown in FIGS. 1A and 1B.

Figure 3:
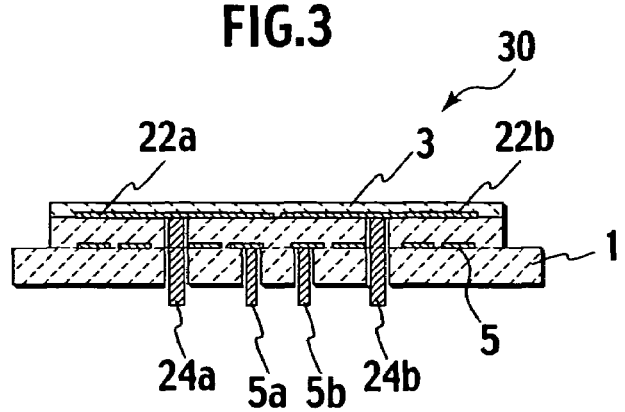
FIG. 3 shows a sectional view of a heater-element-buried electrostatic chuck according to an embodiment of the present invention.

The electrostatic chuck additionally comprises a heater element for heating the substrate. FIG. 3 is a sectional view showing a structure of a bipolar electrostatic chuck 30 having a heater element 5. The electrostatic chuck 30 comprises a ceramic substrate 1, electrodes 22a and 22b, a dielectric ceramic layer 3, a heater element 5, electrode terminals 24a and 24b, and heater element terminals 5a and 5b.

The heater element 5 generates heat while a voltage is applied. The heater element 5 is buried in the ceramic substrate 1. The heater element terminals 5a and 5b, which supply an electric power, are connected to the heater element 5 by brazing. The heater element terminals 5a and 5b are extended from the center of the electrostatic chuck 30.

The heater element 5 is a resistance heating element, and may be made of a high melting point material such as molybdenum (Mo), tungsten (W), or WC; the form of the heater element 5 is not limited. The heater element 5 may be made of, for example, a printed element, which is formed by printing, drying, and sintering a printing paste including metallic powder, bulk metal such as a linear bulk metal, a coiled bulk metal, or a band-shaped bulk metal, or a metallic film. Otherwise, the electrostatic chuck 30 is the same as the electrostatic chuck 20 shown in FIGS. 2A and 2B.

(Electrostatic Chuck Manufacturing Method)

A manufacturing method for the electrostatic chuck 10 comprises forming an alumina sintered body by sintering with ceramic raw material powder including at least about 99.5% by weight alumina in an inert atmosphere or a reduction atmosphere by a hot press method, and forming a planar electrode. The order of these steps is not limited.

Alternatively, the following order, for example, is possible: after forming an alumina compact with the above-mentioned ceramic raw material powder, an electrode is formed on one surface of the alumina compact, and afterwards, the alumina compact and the electrode are sintered together. Further alternatively, the following order is possible: after forming an alumina compact in which an electrode is buried with the above-mentioned ceramic raw material powder, the alumina compact including the electrode are sintered together. Furthermore, after sintering the alumina compact with the above-mentioned ceramic raw material powder, an electrode may be formed on one surface of the alumina sintered body.

Alternatively, the manufacturing method for the electrostatic chuck may include forming an integrated compact in which an electrode is buried, and sintering the integrated compact in an inert atmosphere or in a reduction atmosphere by a hot press method. The step of forming the integrated compact includes forming an alumina compact with the above-mentioned ceramic raw material powder, forming an electrode on the alumina compact, and forming and laminating a ceramic compact on the alumina compact and the formed electrode. According to this, an electrostatic chuck, which is an integrated sintered body obtained by sintering a dielectric ceramic layer 3, an electrode, and an electrostatic substrate 1 together, may be provided.

Alternatively, the manufacturing method for the electrostatic chuck may include a step of forming an integrated body made of the alumina sintered body, the electrode, and the ceramic compact, and a second sintering step of sintering the integrated body in an inert atmosphere or a reduction atmosphere by a hot press method. The step of forming the integrated body includes a first forming step of forming an alumina compact with the above-mentioned ceramic raw material powder, a first sintering step of sintering the alumina compact, a step of forming an electrode on one surface of the alumina sintered body, a second forming step of forming and laminating a ceramic compact on the alumina sintered body and the electrode, This method can provide the electrostatic chuck, which is an integrated body made of the dielectric ceramic layer 3, the electrode 2, and the ceramic substrate 1.

The volume resistivity of the alumina sintered body depends on multiple factors such as purity (concentration of impurity), crystallinity, density, state of grain boundary or the like. Therefore, the volume resistivity of the alumina sintered body can be adjusted by adjusting these factors. For example, by adjusting the purity and the average grain diameter of an alumina powder to be used, and sintering conditions such as a sintering temperature, a sintering atmosphere, an applied pressure during sintering, a sintering method, or a sintering number, an alumina sintered body having a volume resistivity equal to or greater than about $1 \times 10^{17}$ Ω·cm at room temperature and a volume resistivity equal to or greater than about $1 \times 10^{14}$ Ω·cm at 300° C. can be provided, and an alumina sintered body having a volume resistivity equal to or greater than about $1\times10^{17}$ Ω·cm at room temperature and a volume resistivity equal to or greater than about $1\times10^{15}$ Ω·cm at 200° C. can also be provided.

Figure 4A:
FIGS. 4A to 4D are a process chart showing a manufacturing method for an electrostatic chuck according to an embodiment of the present invention.

Next, referencing FIGS. 4A to 4D, a manufacturing method for the electrostatic chuck 10 is exemplified. As shown in FIG. 4A, a disc-shaped alumina compact is formed and then sintered into an alumina sintered body 13. This alumina sintered body 13 is finally to be a dielectric ceramic layer 3, but is preferable to be thicker than the final dielectric ceramic layer 3 so as to be strong enough for undergoing a subsequent grinding step or a hot press sintering step. When forming a dielectric ceramic layer 3 having 0.5 mm thick, the initial thickness thereof should be a few mm to 10 mm.

When forming such an alumina sintered body 13, ceramic raw material powder including alumina as a base is prepared. This ceramic raw material powder may include additional sintering aiding powder such as magnesia (MgO) as well as alumina powder. Note that the alumina powder content is preferably at least about 99.5% by weight. Moreover, it is preferable that the purity of the alumina powder is equal to or greater than about 99.5% by weight.

A binder is blended with this ceramic raw material powder in a predetermined compounding ratio and then mixed by a trommel, for example. In this manner, slurry can be obtained. Afterwards, the slurry is dried to obtain granulated powder. An alumina compact is formed with the obtained granulated powder (first forming step). A disc-shaped alumina compact is formed by a formation method such as a metal molding method, a cold isostatic pressing (CIP) method, or a slip casting method.

The obtained compact is then sintered at approximately 1600° C. to 1700° C. in the air or an inert atmosphere for six hours by, for example, an atmospheric sintering method (first sintering step). Consequently, an alumina sintered body 13 is obtained. This sintering method may be a method other than an atmospheric sintering method. Use of atmospheric sintering allows use of a simple facility, which is preferable. Note that when forming the alumina sintered body 13 in a nitrogen atmosphere by an atmospheric sintering method, the volume resistivity of the alumina sintered body 13 obtained in the first sintering step is approximately $10^{15}$ Ω·cm at room temperature.

Figure 4B:
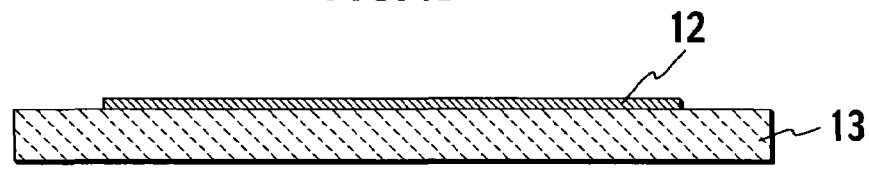

Afterwards, as shown in FIG. 4B, a electrode 12, which is printed is formed on one surface of the alumina sintered body 13. Firstly, one surface of the alumina sintered body 13 is ground into a smooth surface. A printing paste including a metallic powder such as W,Mo, or WC is printed on the obtained smooth surface by screen printing in order to form the printed electrode 12, which is a planar electrode. The printed electrode is then dried. It is preferable that alumina powder in a range from about 5 to about 50% by weight may be added to the printing paste so as to adjust the thermal contraction coefficient for sintering. Moreover, a filmy metallic electrode may be formed on the smooth surface by physical vapor deposition such as sputtering or ion beam deposition, or chemical deposition such as CVD.

Afterwards, the alumina sintered body 13 is set in a metal mold, for example, so that the surface on which the electrode 12 has been formed can be exposed, and granulated powder made of ceramic powder prepared separately is filled from above the printed electrode 12 and the alumina sintered body 13. In this manner, a ceramic compact 11, which is to be the ceramic substrate 1, is formed by a metal molding method (second forming step). It is preferred that the granulated powder may be prepared by mixing alumina powder and sintering aiding powder. Moreover, the purity of the alumina powder can be lower than that of the alumina powder of the alumina sintered body 13, however, it is preferable that the purity of the alumina powder for the ceramic compact 11 is equal to or greater than 99% by weight.

Figure 4C:
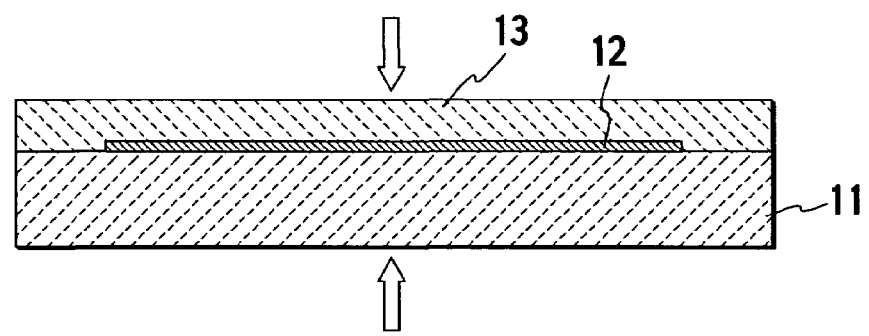

According to such a forming method, an integrated body as shown in FIG. 4C made of the alumina sintered body 13, the printed electrode 12, and the ceramic compact 11 can be obtained, thereby integrating the alumina sintered body 13, the printed electrode 12, and the ceramic compact 11.

Subsequently, that integrated body made of the alumina sintered body 13, the printed electrode 12, and the ceramic compact 11 is sintered by a hot press method while being applied a certain pressure in uniaxial direction as shown in FIG. 4C (second sintering step). Sintering conditions are not limited; however, it is preferable that sintering is carried out in an inert atmosphere, which is generated by introducing an inert gas such as nitrogen or argon in a decompressed atmosphere, or a reduction atmosphere for approximately one to three hours at a temperature of about 1600° C. to about 1700° C. Also, it is preferable that the applied pressure is about 5 MPa to about 30 MPa. This can provide an integrated sintered body made of the alumina sintered body 13, the printed electrode 12, and the ceramic compact 11.

Going through two sintering steps, the volume resistivity of the alumina sintered body 13 becomes $1\times10^{17}$ Ω·cm or greater in room temperature and $1\times10^{14}$ Ω·cm or greater at 300° C.

Figure 4D:
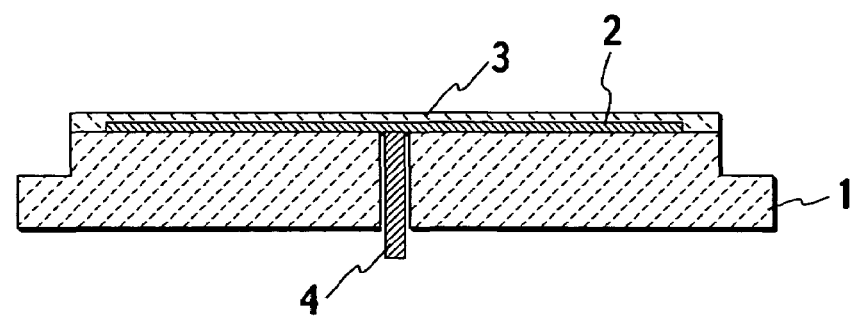

Lastly, as shown in FIG. 4D, the alumina sintered body 13 is ground and adjusted to be about 0.05 to about 0.50 mm in thickness, resulting in a dielectric ceramic layer 3. The substrate contact surface of the dielectric ceramic layer 3 is then ground to be equal to or less than about 0.5 μm in surface roughness (Ra). A hole into which an electrode terminal 4 is to be inserted is formed in the sintered ceramic body, and cylindrical ceramics covering the circumference of the electrode terminal 4 is inserted into that hole if necessary. The electrode terminal 4 is connected to the electrode 2 by brazing, for example. In this manner, an electrostatic chuck 10 shown in FIG. 4D is provided.

The dielectric ceramic layer 3 is made of the alumina sintered body 13, the electrode 2 is made of the printed electrode 12, and the ceramic substrate 1 is made of the sintered ceramic body, which is obtained by sintering the ceramic compact 11. Note that the sides of the alumina sintered body 13 and the sintered ceramic body are ground to narrow the area of the substrate contact surface as shown in FIG. 4D.

According to such a manufacturing method for an electrostatic chuck, through two sintering steps, the dielectric ceramic layer 3 made of an alumina sintered body having an extremely high volume resistivity equal to or greater than $1\times10^{17}$ Ω·cm at room temperature can be formed. Moreover, since the alumina sintered body 13, the printed electrode 12, and the ceramic compact 11 are formed as an integrated sintered body through the second forming step and sintering by a hot press method (the second sintering step), an electrostatic chuck 10 not having a joint layer can be obtained. Especially, in the case of using alumina powder as raw material powder for the ceramic compact 11, an excellent joint with the alumina sintered body 13 can be provided, and an integrated sintered body with hardly any joint interface can be formed. Therefore, the provided electrostatic chuck 10 can prevent the electrode 2 from corroding due to a gas penetrating from the joint of the dielectric ceramic layer 3 and the ceramic substrate 1, even if it is used in a corrosive atmosphere.

According to this manufacturing method, the alumina sintered body 13 is formed separately, and one surface thereof is ground to a smooth plane on which the printed electrode 12 is then formed. After sintering by a hot press method, final adjustment of the alumina sintered body thickness or the thickness of the dielectric ceramic layer 3 is carried out by grinding. Therefore, this manufacturing method allows high-precision control of the thickness of the dielectric ceramic layer 3. More specifically, this manufacturing method allows fine adjustment of the thickness of the dielectric ceramic layer 3 to an extremely thin 0.5 mm or less and in a uniform thickness. As a result, according to this manufacturing method, the electrostatic chuck 10, which is the Coulomb-type electrostatic chuck having a strong chucking force and uniform chucking force over the entire surface (ensuring uniform chucking force over the entire surface) can be provided.

Note that it is not always necessary to execute the sintering step twice, and alternatively, the electrostatic chuck 10 may be manufactured by executing the sintering step by a hot press method only once. In this case, a disc-shaped alumina compact is formed by, for example, a press-molding method by a metal mold. The obtained alumina compact is then set on the bottom of the mold, and on the upper surface thereof a bulk metal such as a planar mesh electrode is then mounted. Afterwards, from above the alumina compact and the mesh electrode, ceramic raw material powder such as alumina powder is filled and press-molded. This can provide an integrated compact made from the alumina compact and the ceramic compact. The obtained integrated compact is then sintered in order to obtain an integrated sintered body by a hot press method. Lastly, in the same procedure as that for the manufacturing method shown in FIG. 4D, the dielectric ceramic layer 3 is ground and adjusted to be a predetermined thickness.

Alternatively, the alumina sintered body, which becomes, for example, the dielectric ceramic layer 3, may be obtained by sintering multiple times (e.g., two times) by a hot press method, which can provide an alumina sintered body having a volume resistivity equal to or greater than $1 \times 10^{17} \Omega \cdot cm$ at room temperature and a volume resistivity equal to or greater than $1 \times 10^{15} \Omega \cdot cm$ at 200° C. An alumina sintered body, which is obtained by sintering an alumina compact by the hot press method, may be sintered by the hot press method at the same time as the ceramic compact sintering time, resulting in sintering being executed twice by hot pressing.

When manufacturing the electrostatic chuck 30 having the heater element 5 as shown in FIG. 3, the ceramic compact 11 in which the coil-shaped heater element made of a bulk metal is buried may be formed, or a printed element may be formed on the ceramic sintered body, which allows manufacturing of the ceramic substrate 1 having the heater element 5. Otherwise, the electrostatic chuck 30 may be manufactured in the same manner as manufacturing for the electrostatic chuck 10.

Note that the present invention is not limited to the description of the aforementioned embodiment. According to the manufacturing method for the electrostatic chuck of the aforementioned embodiment, for example, even the ceramic substrate 1 is sintered by a hot press method; alternatively, only the alumina sintered body, which becomes the dielectric ceramic layer 3, may be obtained by sintering by a hot press method while the ceramic substrate 1 may be obtained by another sintering method such as an atmospheric sintering. After formation of only the alumina sintered body, which becomes the dielectric ceramic layer 3, by sintering by a hot press method, a filmy electrode is formed on one surface of the alumina sintered body by, for example, a screen printing method or a variety of deposition methods. Alternatively, a simple structured electrostatic chuck may be provided by joining with an adhesive, an alumina sintered body having a filmy electrode to a ceramic sintered body separately manufactured.

According to the above-mentioned embodiment, the ceramic substrate 1 is used; alternatively, other types of substrates may be used. For example, a metallic material or a composite material made from ceramics and a metal may be used for the substrate. In this case, for example, an insulative adhesive may be used to join the alumina sintered body having a filmy electrode to the substrate, resulting in an electrostatic chuck.

As described so far, according to such electrostatic chucks 10 to 30, as compared to the conventional alumina sintered bodies, the dielectric ceramic layer 3 may be made of an alumina sintered body having an extremely high volume resistivity over a wide temperature range. This allows electrostatic chucks 10 to 30, which are Coulomb-type electrostatic chucks to provide a stabilized chucking force over a wide temperature range. Moreover, these electrostatic chucks 10 to 30 allow reduction of leakage current flowing to the substrate therefrom. Furthermore, according to the electrostatic chucks 10 to 30, since electric charge barely exists in the dielectric ceramic layer 3, the response speed for dechucking the substrate is high, providing an excellent dechucking response.

In recent years, semiconductors have been miniaturized, and there is fear that leakage current to substrates may adversely and strongly affect semiconductor characteristics. Moreover, semiconductor manufacturing processes and LCD manufacturing processes have diversified, and temperature conditions have also diversified. According to the electrostatic chucks 10 to 30, a stabilized chucking force is maintained over a wide temperature range from a low temperature to a high temperature, with a very small amount of leakage current. This can respond to the next generation of semiconductor manufacturing processes for microscopic semiconductor manufacturing, which require complete control of leakage current and diversified temperature conditions, and are therefore very useful.

Moreover, according to the above-mentioned manufacturing method for the electrostatic chucks 10 to 30, as compared to the conventional alumina sintered bodies, a highly pure alumina sintered body having an extremely high volume resistivity over a wide temperature range can be provided. Furthermore, electrostatic chucks 10 to 30, which are Coulomb-type electrostatic chucks using this alumina sintered body as the dielectric ceramic layer 3 can be provided. This allows such a manufacturing method to provide a stabilized chucking force over a wide temperature range, and also allows reduction in leakage current flowing from an electrostatic chuck to a substrate, providing an electrostatic chuck having an excellent dechucking response. Also, according to such a manufacturing method, since the purity of the dielectric ceramic layer 3 can be improved, electrostatic chucks 10 to 30, which cannot be a contamination source for the substrate, can be provided.

(Alumina Sintered Member and Manufacturing Method for the Same)

The alumina sintered body used for the aforementioned dielectric ceramic layer 3 can be used not only as the dielectric ceramic layer 3 of the electrostatic chucks 10 to 30 but also as an independent alumina sintered member or in combination with another member. In other words, the alumina sintered body can be used as an alumina sintered member having a volume resistivity equal to or greater than about $1 \times 10^{17} \Omega \cdot cm$ at room temperature and a volume resistivity equal to or greater than about $1 \times 10^{14}$ Ω·cm at 300° C. or as an alumina sintered member having a volume resistivity equal to or greater than about $1 \times 10^{17}$ Ω·cm at room temperature and a volume resistivity equal to or greater than about $1 \times 10^{15}$ Ω·cm at 200° C.

According to such alumina sintered member, excellent insulation can be maintained over a wide temperature range. Therefore, the alumina sintered body can be used for a variety of applications needing excellent insulation over a wide temperature range.

Such an alumina sintered member may be used as a susceptor, a heater base material, a ring member, a chamber member or the like, which may be used in a semiconductor manufacturing apparatus. Also, such an alumina sintered member may be used as a highly insulative material having heat-resistance and corrosion resistance over a wide temperature range.

It is preferable that an alumina sintered member having a volume resistivity equal to or greater than about $1 \times 10^{14}$ Ω·cm at 300° C. have a volume resistivity equal to or greater than about $1 \times 10^{14}$ Ω·cm at 400° C. Accordingly, the alumina sintered member can maintain excellent insulation over a wider temperature range, and can be used for applications needing excellent insulation over a wider temperature range.

It is preferable that an alumina sintered member has a volume resistivity equal to or greater than about $1 \times 10^{15}$ Ω·cm at 300° C. Also, it is preferable that an alumina sintered member has a volume resistivity equal to or greater than about $1 \times 10^{15}$ Ω·cm at 200° C.

Moreover, It is preferable that the alumina sintered member has a purity equal to or greater than about 99.5% by weight, and a density in a range from about 3.80 to about 4.00 g/cm$^3$. According to this, an alumina sintered member, which has a high volume resistivity over a wide temperature range and excellent corrosion resistance due to that high density and which cannot be a contamination source because of that high purity, may be provided. Accordingly, such an alumina sintered member may be used for applications, which cannot allow a semiconductor manufacturing process or the like to be contaminated. A further preferable purity of a alumina sintered member is equal to or greater than about 99.7% by weight. A further preferable density of a alumina sintered member is in a range from about 3.93 to about 4.00 g/cm$^3$.

Moreover, it is preferable that the bending strength of the alumina sintered member is equal to or greater than about 350 MPa. According to this, the alumina sintered body hardly occurs any breakage such as cracks when being processed such as being drilled. In addition, since the alumina sintered member hardly chips even when in use, generation of particles can be prevented and durability can be enhanced. Further preferable bending strength is equal to or greater than about 365 MPa. Note that it is preferable that the open porosity, the maximum pore diameter, and the withstand voltage of the alumina sintered member should be the same as those of the alumina sintered body structuring the dielectric ceramic layer 3.

Furthermore, it is preferable that the alumina sintered member is obtained by sintering in an inert atmosphere or a reduction atmosphere by a hot press method. According to this, the alumina sintered member can have a high density due to an applied pressure given by a hot press method and a high volume resistivity.

Such an alumina sintered member may be manufactured using a manufacturing method, which includes sintering with ceramic raw material powder including alumina at least about 99.5% by weight in an inert atmosphere or a reduction atmosphere by a hot press method and thereby manufacturing an alumina sintered body having a volume resistivity equal to or greater than about $1 \times 10^{17}$ Ω·cm at room temperature and a volume resistivity equal to or greater than about $1 \times 10^{14}$ Ω·cm at 300° C., or an alumina sintered member having a volume resistivity equal to or greater than about $1 \times 10^{17}$ Ω·cm at room temperature and a volume resistivity equal to or greater than about $1 \times 10^{15}$ Ω·cm at 200° C.

A forming method for a compact and a sintering method may be the same as those for the dielectric ceramic layer 3. According to such a manufacturing method for the alumina sintered member, a highly pure alumina sintered member having an extremely high volume resistivity over a wide temperature range can be provided. Therefore, according to such a manufacturing method for the alumina sintered body, excellent insulation can be maintained over a wide temperature range, and an alumina sintered member having a high heat-resistance and excellent corrosion resistance, which does not become a contamination source, can be provided.

EXAMLPES

The present invention is explained more in detail by showing working examples forthwith; however, the present invention is not limited thereto.

Working Example 1

A mixed powder of alumina powder having a purity of 99.7% by weight (and an average grain diameter of 1 μm) and MgO powder as sintering aiding powder are used as ceramic raw material powder. The MgO content in the ceramic raw material powder is 0.04% by weight. Water, a dispersant, and polyvinyl alcohol (PVA) as a binder are added to this ceramic raw material powder, and then mixed for 16 hours into slurry by a trommel. The obtained slurry is sprayed and dried by a spray dryer, forming granulated powder having an average grain diameter of approximately 80 μm.

Afterwards, the formed granulated powder are placed in a rubber mold, and an alumina compact is then formed by a cold isostatic pressing (CIP) apparatus applying a pressure of 1 ton/cm$^2$. After this alumina compact is dried, it is placed in an alumina sheath, and the alumina sheath including that alumina compact is placed in a sintering furnace and then sintered. This sintering is carried out under such temperature profile: firstly, the temperature is raised from room temperature to 500° C. at 10° C./h, 500° C. is maintained for five hours in order to remove the binder, the temperature is raised from 500° C. to 1650° C. at 30° C./h, and lastly 1650° C. is maintained for four hours. Consequently, the alumina sintered body 13 shown in FIG. 4A is provided.

Next, the alumina sintered body is ground to be a disc having a diameter of F300 mm and a thickness of 6 mm. At this time, one surface thereof is ground to be a smooth surface having roughness (Ra) equal to or less than 0.8 μm.

60% by weight tungsten (W), 40% by weight alumina powder, terpineol, which is a binder, are mixed into a printing paste. As shown in FIG. 4B, a printed electrode 12 having a thickness of 10 μm and a diameter of 290 mm is formed on the alumina sintered body by screen printing with the printing paste, and then dried.

Afterwards, the alumina sintered body 13 formed the Printed electrode 12 is set in a metal mold, granulated powder made of ceramic raw material powder prepared separately is filled, and these are then press-molded under a pressure of 200 kg/cm$^2$. The filled ceramic raw material powder is prepared in the same way as alumina sintered body 13 other than not adding a binder.

Subsequently, the compact is set in a carbon sheath, and as shown in FIG. 4C, is then sintered by a hot press method. This sintering is carried out in a pressurized nitrogen atmosphere (150 kPa) under a pressure of 10 MPa at a temperature that rises at 300° C./h up to 1600° C., which is then maintained for two hours. Consequently, an integrated sintered body made of the alumina sintered body 13, the electrode 2, and the sintered ceramic body is provided.

Afterwards, the surface of the alumina sintered body 13 obtained by sintering twice is ground by a diamond whetstone to be 0.1 mm in thickness, which is a distance from the buried electrode to the surface of the alumina sintered body 13. The substrate contact surface of the dielectric ceramic layer 3 is then ground to be 0.5 µm or less in surface roughness (Ra). The side of the sintered body is ground, and then subjected to necessary processing such as drilling, attaching cylindrical ceramics covering the circumference of the electrode terminal 4, and connecting the electrode terminal 4 to the electrode 2, resulting in an electrostatic chuck 10.

Working Example 2

With the same procedure as that for the working example 1, alumina granulated powder having an average grain diameter of approximately 80 µm is formed from alumina powder having a purity of 99.7% by weight. Those alumina granulated powder is filled in a mold, and is press-molded under a pressure of 200 kg/cm². A Mo mesh electrode (mesh electrode) having a wire diameter of 0.12 mm is mounted on the resulting alumina compact. The same alumina granulated powder is filled on the surfaces of the alumina compact and the mesh electrode, and these are then press-molded under a pressure of 200 kg/cm².

The resulting integrated compact is placed in a carbon sheath, and then sintered by a hot press method. This sintering is carried out in a pressurized nitrogen atmosphere (150 kPa) under a pressure of 10 MPa at a temperature rising at 300° C./h up to 1600° C., which is then maintained for 2 hours. Consequently, an integrated sintered body made of the alumina sintered body 13, the electrode 2, and the sintered ceramic body is provided.

Afterwards, the surface of the alumina sintered body 13, which becomes the dielectric ceramic layer 3, is ground by a diamond whetstone and adjusted to be 0.1 mm in thickness, which is a distance from the buried electrode to the surface of the alumina sintered body 13. The substrate contact surface of the dielectric ceramic layer 3 is then ground to be 0.5 µm or less in surface roughness (Ra). Necessary processing such as drilling, attaching cylindrical ceramics covering the circumference of the electrode terminal 4, and connecting the electrode terminal 4 to the electrode 2 is carried out, resulting in an electrostatic chuck 10 having a diameter of F300 mm.

Working Example 3

A mixed powder of alumina powder having a purity of 99.7% by weight (and an average grain diameter of 1 µm) and MgO powder as sintering aiding powder are used as ceramic raw material powder. The MgO content in the ceramic raw material powder is 0.04% by weight. Water, a dispersing agent, and polyvinyl alcohol (PVA) as a binder are added to this ceramic raw material powder, and then mixed for 16 hours into slurry by a trommel. The obtained slurry is sprayed and dried by a spray dryer, and is held at 500° C. for five hours in order to remove the binder. In this manner, granulated powder having an average grain diameter of approximately 80 µm is obtained.

Afterwards, the obtained granulated powder are placed in a metal mold, and then press-molded under a pressure of 200 kg/cm², into an alumina compact. The obtained alumina compact is placed in a carbon sheath and then sintered by a hot press method. This sintering is carried out in a pressurized nitrogen atmosphere (150 kPa) under a pressure of 10 MPa at a temperature rising at 300° C./h up to 1600° C., which is then maintained for 2 hours. Consequently, the alumina sintered body 13 shown in FIG. 4A is provided.

The alumina sintered body is ground to be 300 mm in diameter and 6 mm in thickness. At this time, one surface thereof is ground to be a smooth surface having a surface roughness (Ra) of 0.8 µm or less.

60% by weight tungsten (W), 40% by weight alumina powder, terpineol, which is a binder, are mixed into a printing paste. As shown in FIG. 4B, a printed electrode 12 having a thickness of 10 µm and a diameter of 290 mm is formed on the alumina sintered body by screen printing with the printing paste, and then dried.

Afterwards, the alumina sintered body 13 including the printed electrode 12 is set in a metal mold, which is then filled with the granulated powder used for the sintered alumina boy 13, and press-molding is then carried out with a pressure of 200 kg/cm². Subsequently, the resulting alumina compact is placed in a carbon sheath and then sintered by a hot press method, as shown in FIG. 4C. This sintering is carried out in a pressurized nitrogen atmosphere (150 kPa) under a pressure of 10 MPa at a temperature rising at 300° C./h up to 1600° C., which is then maintained for 2 hours. Consequently, an integrated sintered body made of the alumina sintered body 13, the electrode 2, and the sintered ceramic body is provided.

Afterwards, the surface of the alumina sintered body 13 obtained by sintering twice is ground by a diamond whetstone to be 0.1 mm in thickness, which is a distance from the buried electrode to the surface of the alumina sintered body 13. The substrate contact surface of the dielectric ceramic layer 3 is then ground to be 0.5 µm or less in surface roughness (Ra). The side of the sintered body is ground and subjected to necessary processing such as drilling, attaching cylindrical ceramics covering the circumference of the electrode terminal 4, and connecting the electrode terminal 4 to the electrode 2, resulting in a electrostatic chuck 10.

Comparative Example

A mixed powder of alumina powder having purity of 99.5% by weight (and an average grain diameter of 1 µm) and MgO powder as sintering aiding powder are used as ceramic raw material powder. The MgO content in the ceramic raw material powder is 0.04% by weight. A binder is added to this ceramic raw material powder, and then mixed into slurry by a trommel. Note that isobutyl ester methacrylate and butyl ester and nitrocellulose are used as a binder while trichloroethylene and n-butanol are used as an organic solvent. An alumina molded sheet having a thickness of 0.1 mm is formed by a doctor blade method with this slurry.

This alumina molded sheet is cut to be F300 mm in diameter. An electrode having a diameter of F290 mm and a thickness of 10 µm is formed on one surface of the alumina molded sheet by screen printing with the same printing paste as that for the working examples 1 to 3, and then dried.

With the same procedure as those for the aforementioned methods, a plurality of alumina molded sheets formed by a doctor blade method are laminated on the above-mentioned alumina molded sheet including the electrode. These alumina sheet laminated body is press-molded and entirely pressure bonded into an integrated body.

Afterwards, the integrated alumina sheet laminated body is set in an alumina sheath, and sintered in a sintering furnace. This sintering is carried out under such temperature profile: firstly, the temperature is raised from room temperature to 500° C. at 10° C./h, 500° C. is maintained for five hours in order to remove the binder, the temperature is raised from 500° C. to 1650° C. at 30° C./h, and lastly, 1650° C. is maintained for four hours. An electrostatic chuck having a diameter of 300 mm is completed by grinding, drilling, attaching cylindrical ceramics covering the circumference of the electrode terminal, and connecting the electrode terminal to the electrode.

Evaluation Method

The alumina sintered body, which is a dielectric ceramic layer of each of the electrostatic chucks according to the working examples 1 to 3 and the comparative example, is evaluated in terms of a volume resistivity, purity, density, open porosity, maximum pore diameter, thermal conductivity, withstand voltage, bending strength, and impurity content.

(1) Volume resistivity: measured according to JIS C2141. This measurement is made under vacuum and at room temperature (25° C.), 100° C., 200° C., 300° C., 400° C., and 500° C. The specimen configuration is $\phi 50 \times t1$ mm. Electrodes are formed with a silver paste so that the main electrode diameter can be 20 mm; the guarding electrode inner diameter be 30 mm, the guarding electrode outer diameter be 40 mm, and the voltage applied electrode diameter be 45 mm;

(2) Purity: calculated the alumina sintered body using the impurity analysis results;

(3) Density: evaluated according to the Archimedes method using pure water as a medium;

(4) Open porosity: evaluated according to the Archimedes method using pure water as a medium;

(5) Maximum pore diameter: observed mirror surface of the alumina sintered body polished by optical microscope using ×400;

(6) Heat conductivity: measured by the laser-flash method;

(7) Withstand voltage: measured according to JIS C2141;

(8) Bending strength: measured Four-point bending strength at room temperature according to JIS R1601;

(9) Impurity content analysis: determined quantity by inductively coupled plasma (ICP) emission spectrum analysis;

Moreover, the electrostatic chucks according to the working examples 1 to 3 and the comparative example are evaluated in terms of chucking force and dechucking response characteristics. A more specific measurement method is described below.

(10) Chucking force: A probe made of silicon (hereafter, called 'silicon probe') is made to be in contact with the substrate contact surface of the electrostatic chuck under vacuum, and a voltage of 2000 VDC is applied between the electrode of the electrostatic chuck and the silicon probe, resulting in the silicon probe being chucked and held on the electrostatic chuck. While applying a voltage, a force (chucking force) needed to pull the silicon probe upward off the substrate contact surface of the electrostatic chuck is measured over a temperature range from room temperature (25° C.) to 400° C. after sixty seconds from the beginning of voltage application.

(11) Dechucking response: The silicon probe is made to be in contact with the substrate contact surface of the electrostatic chuck under vacuum, and a voltage of 2000 VDC is applied between the electrode of the electrostatic chuck and the silicon probe, resulting in the silicon probe being chucked and held on the electrostatic chuck. The silicon probe is pulled upwards using a force of 5 Torr ($6.7 \times 10^2$ Pa) after thirty seconds from the beginning of voltage application. Afterwards, application of the voltage is stopped after sixty seconds from the beginning of voltage application, and a time needed for the silicon probe to come off the electrostatic chuck (dechucking time) (sec) is measured over a temperature range from room temperature (25° C.) to 400° C.

Evaluation Results

<Volume Resistivity of Dielectric Ceramic Layer>

Figure 5:
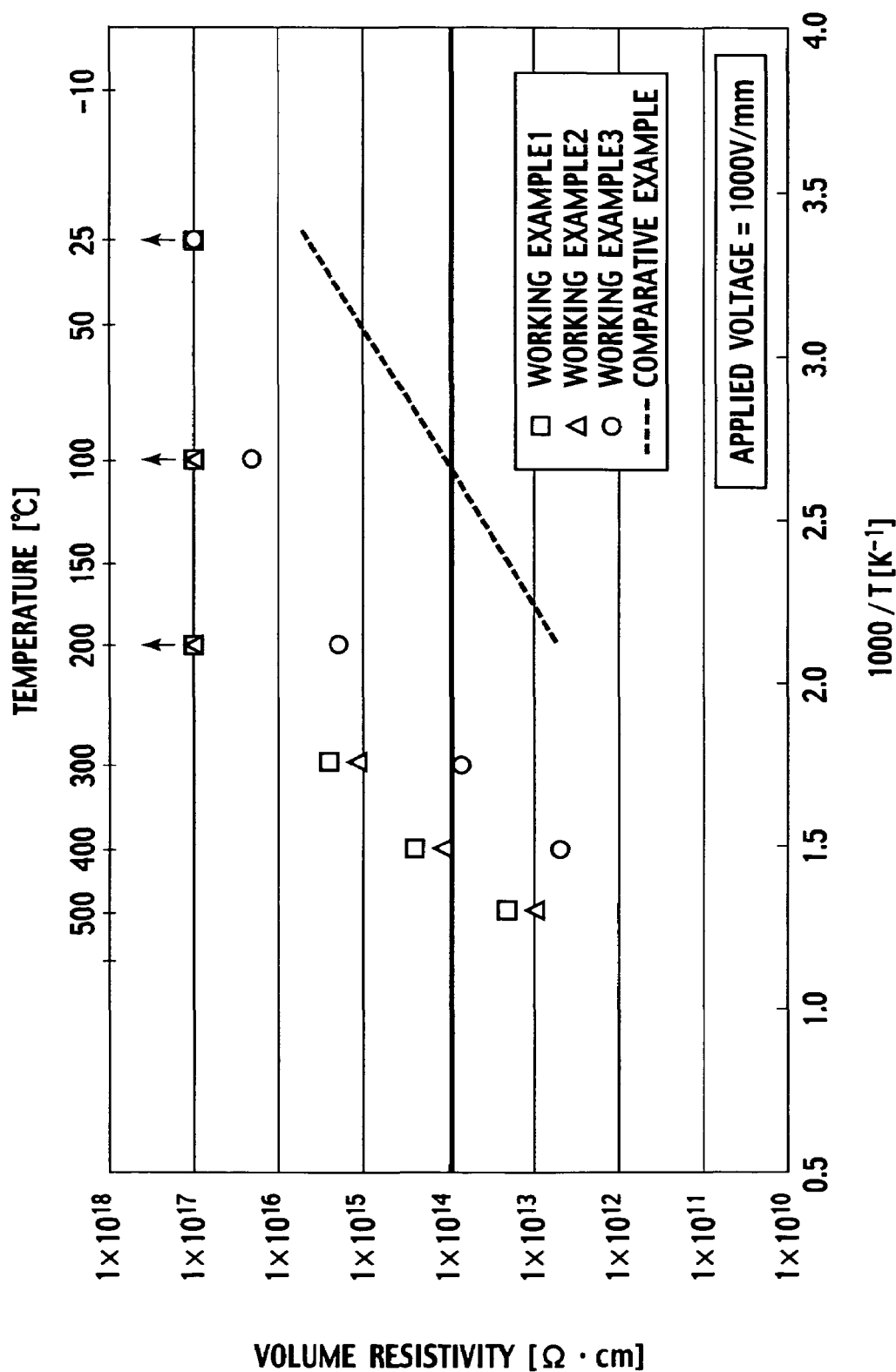
FIG. 5 is a graph showing temperature dependency of the volume resistivity of an electrostatic chuck.

The volume resistivity measurement results are shown in Table 1 and FIG. 5. In FIG. 5, the vertical axis represents the volume resistivity (Ω·cm), the upper horizontal axis in the graph represents temperature (° C.), and the lower horizontal axis in the graph represents $1000/T(K^{-1})$.

TABLE 1

| | VOLUME RESISTIVITY (Ω · cm) | | | | | |
|---|---|---|---|---|---|---|
| | ROOM TEMPERATURE | 100° C. | 200° C. | 300° C. | 400° C. | 500° C. |
| WORKING EXAMPLE1 | >1 × 10$^{17}$ | >1 × 10$^{17}$ | >1 × 10$^{17}$ | 2 × 10$^{15}$ | 2 × 10$^{14}$ | 2 × 10$^{13}$ |
| WORKING EXAMPLE2 | >1 × 10$^{17}$ | >1 × 10$^{17}$ | >1 × 10$^{17}$ | 1 × 10$^{15}$ | 1 × 10$^{14}$ | 1 × 10$^{13}$ |
| WORKING EXAMPLE3 | >1 × 10$^{17}$ | 2 × 10$^{16}$ | 2 × 10$^{15}$ | 7 × 10$^{13}$ | 5 × 10$^{12}$ | — |
| COMPARATIVE EXAMPLE | 5 × 10$^{15}$ | 1 × 10$^{14}$ | 5 × 10$^{12}$ | — | — | — |

Table 1 and the graph of FIG. 5 show that the dielectric ceramic layers (alumina sintered bodies) of the electrostatic chucks according to the working examples 1 and 2 have high volume resistivities equal to or greater than about $1 \times 10^{17}$ Ω·cm over a temperature range between room temperature and 200° C. They also show high volume resistivities equal to or greater than about $1 \times 10^{15}$ Ω·cm over a temperature range between 200° C. and 300° C. and high volume resistivities equal to or greater than about $1 \times 10^{14}$ Ω·cm over a wide temperature range between room temperature and 400° C.

It is also shown that the dielectric ceramic layer (alumina sintered body) of the electrostatic chuck according to the working example 3 has a high volume resistivity equal to or greater than about $1 \times 10^{17}$ Ω·cm at room temperature. Moreover, it is shown that a high volume resistivity equal to or greater than about $1 \times 10^{16}$ Ω·cm is maintained at 100° C. Furthermore, a high volume resistivity equal to or greater than about $1\times10^{15}\Omega\cdot cm$ is shown over a temperature range between 100° C. and 200° C., and a high volume resistivity equal to or greater than about $1\times10^{15}\Omega\cdot cm$ is shown over a wide temperature range between room temperature and 200° C.

On the other hand, it is shown that the volume resistivity of the alumina sintered body according to the comparative example, which is manufactured in the air by an atmospheric sintering, is very low and $1\times10^{15}\Omega\cdot cm$ at room temperature as compared to those at room temperature. Moreover, it is shown that the volume resistivity is $1\times10^{14}\Omega\cdot cm$ or less at a temperature of 100° C. or greater, and that the volume resistivity is in an order of $10^{12}\Omega\cdot cm$ at a temperature of 200° C. This means that the volume resistivity according to the comparative example cannot maintain a high value corresponding to the working examples over a wide temperature range.

<Purity, Density, Open Porosity, Maximum Pore Diameter, Thermal Conductivity, withstand Voltage, Bending Strength, and Impurity Content of Dielectric Ceramic Layer>

The measurement results of purity, density, open porosity, maximum pore diameter, thermal conductivity, withstand voltage, bending strength, and impurity content are shown in Table 2. The impurity content measurement results are shown in Table 3.

TABLE 2

|  | WORKING EXAMPLE1 | WORKING EXAMPLE2 | WORKING EXAMPLE3 | COMPARATIVE EXAMPLE |
|---|---|---|---|---|
| PURITY (WT. %) | >99.5 | >99.5 | >99.5 | >99.5 |
| DENSITY (g/cm³) | 3.95 | 3.94 | 3.93 | 3.90 |
| OPEN POROSITY (%) | 0.0 | 0.0 | 0.0 | 0.1 |
| MAXIMUM PORE DIAMETER (μm) | 100 | 10 | 10 | 200 |
| THERMAL CONDUCTIVITY (w/mk) | 30 | 28 | 29 | 30 |
| WITHSTAND VOLTAGE (kV/mm) | 18 | 20 | 20 | 13 |
| BENDING STRENGTH (MPa) | 370 | 380 | 368 | 310 |

TABLE 3

| IMPURITY | WORKING EXAMPLE1 | WORKING EXAMPLE2 | WORKING EXAMPLE3 | COMPARATIVE EXAMPLE |
|---|---|---|---|---|
| Si | 490 | 495 | 483 | 450 |
| Fe | 70 | 78 | 75 | 70 |
| Ca | 345 | 350 | 362 | 914 |
| Mg | 365 | 360 | 358 | 344 |
| K | 30 | 29 | 29 | 15 |
| Na | 190 | 195 | 190 | 70 |
| Cr | 2 | 3 | 2 | 3 |
| Mn | <1 | <1 | <1 | <1 |
| Ni | 1 | 1 | 1 | 1 |
| Cu | <1 | <1 | <1 | <1 |
| Zn | 1 | 1 | 1 | 1 |
| Y | 160 | 170 | 175 | 800 |

(ppm)

Table 2 shows that the purity of each of the alumina bodies according to the working examples 1 to 3 is equal to or greater than 99.5% by weight i.e., very high. It also shows that the alumina sintered bodies according to the working examples 1 to 3 have an extremely high density as compared to the comparative example. Moreover, it shows that the alumina sintered bodies according to the working examples 1 to 3 are 0.0(%) in open porosity, which means there are no pores, however, alumina sintered body of the comparative example has pores. The maximum pore diameter of each of the alumina sintered bodies according to the working examples 1 to 3 is shown to be equal to or less than 100 μm. In particular, the maximum pore diameter of each of the working examples 2 and 3 is shown to be small and 10 μm. On the other hand, the maximum pore diameter of the comparative example is shown to be large and 200 μm. In summary, according to the working examples, alumina sintered bodies having an extremely high density are formed.

The alumina sintered bodies according to the working examples 1 to 3 are shown to have excellent thermal conductivity. Also, the alumina sintered bodies according to the working examples 1 to 3 are shown to have very high withstand voltages as compared to the comparative example. The bending strength of each of the alumina sintered bodies according to the working examples 1 to 3 exceeds 350 MPa and is very strong as compared to the alumina sintered body according to the comparative example.

Table 3 shows that the impurity contents included in the respective sintered alumina bodies, according to the working examples, are different from that according to the comparative example. It is found that the alumina sintered body according to the comparative example includes a lot of calcium (Ca) and yttrium (Y) as compared to those according to the working examples 1 to 3. However, it is found that the contents of Ca and Y included in the alumina sintered bodies according to the working examples 1 to 3 are small, and purities thereof are high.

<Chucking Force and Dechucking Response>

Figure 6:
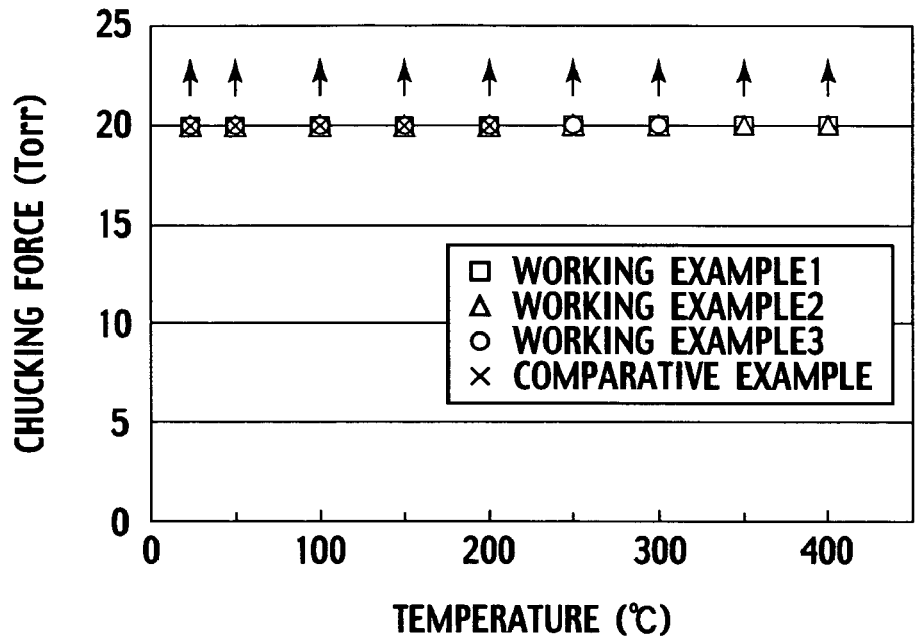
FIG. 6 is a graph showing temperature dependency of the chucking force of the electrostatic chucks.
Figure 7:
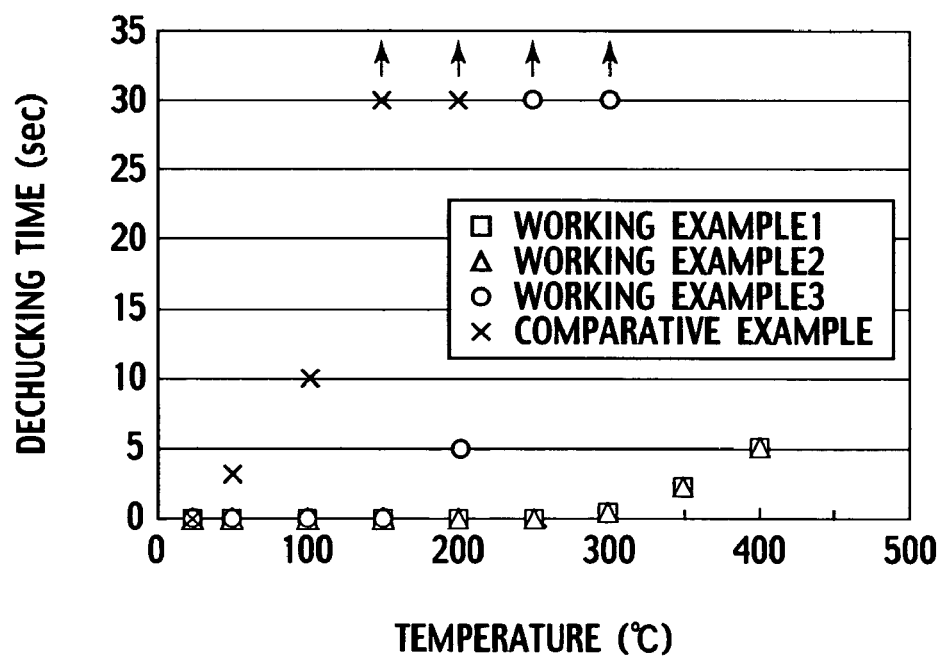
FIG. 7 is a graph showing temperature dependency of the dechucking response of the electrostatic chuck.

The chucking force measurement results are shown in FIG. 6, and the dechucking response measurement results are shown in FIG. 7. The vertical axis of FIG. 6 represents chucking force (Torr), and the horizontal axis represents temperature (° C.). The vertical axis of FIG. 7 represents dechucking time (sec), and the horizontal axis thereof represents temperature (° C.).

FIG. 6 shows that the alumina sintered bodies according to the working examples 1 to 3 maintain high chucking forces of 20 Torr ($2.66\times10^3$ Pa) or greater over a wide temperature range from room temperature to 300° C. It is also shown that the alumina sintered bodies according to the working examples 1 and 2 maintain high chucking forces at a temperature of 300° C. or greater, and high chucking forces of 20 Torr ($2.66\times10^3$ Pa) or greater over a wider temperature range from room temperature to 400° C.

FIG. 7 shows that the electrostatic chucks according to the working examples 1 and 2 have a short substrate dechucking time of five seconds or less over a wide temperature range from room temperature to 400° C., which means an excellent dechucking response. In particular, the electrostatic chucks according to the working examples 1 and 2 are capable of quickly dechucking at 300° C. or less at which the volume resistivities are $10^{15}\Omega\cdot cm$ or greater. The electrostatic chuck according to the working example 3 has a short substrate dechucking time of five seconds or less over a wide temperature range from room temperature to 200° C., which means an excellent dechucking response. In particular, the electrostatic chuck according to the working example 3 is capable of quickly dechucking at 150° C. or less. However, the chucking force of the electrostatic chuck according to the comparative example decreases as temperature increases. The electrostatic chuck according to the comparative example has a poorer dechucking response than those according to the working examples at all temperatures. In particular, the electrostatic chuck according to the comparative example has a substrate dechucking time of thirty seconds or greater for the volume resistivity of $10^{14}$ cm or less at 150° C. or greater.

Although the inventions have been described above by reference to certain embodiments of the inventions, the inventions are not limited to the embodiments described above. Modifications and variations of the embodiments described above will occur to those skilled in the art, in light of the above teachings.

What is claimed is:

1. An electrostatic chuck, comprising:
    a dielectric ceramic layer made of an alumina sintered body having a volume resistivity equal to or greater than about $1\times10^{17}\Omega\cdot cm$ at room temperature and a volume resistivity equal to or greater than about $1\times10^{14}\Omega\cdot cm$ at 300° C.; and
    an electrode formed on one surface of the dielectric ceramic layer.

2. The electrostatic chuck, according to claim 1, wherein the alumina sintered body has a volume resistivity equal to or greater than about $1\times10^{14}\Omega\cdot cm$ at 400° C.

3. The electrostatic chuck, according to claim 1, wherein the alumina sintered body has a purity equal to or greater than about 99.5% by weight, and a density in a range from about 3.80 to about 4.00 g/cm³.

4. The electrostatic chuck, according to claim 1, wherein the alumina sintered body is sintered in an inert atmosphere or a reduction atmosphere by hot press method.

5. The electrostatic chuck, according to claim 1, wherein the dielectric ceramic layer has a thickness in a range from about 0.05 mm to about 0.50 mm.

6. The electrostatic chuck, according to claim 1, further comprising:
    a ceramic substrate joined to the dielectric ceramic layer via the electrode;
    wherein the dielectric ceramic layer, the electrode, and the ceramic substrate are an integrated body by hot press method.

7. The electrostatic chuck, according to claim 6, wherein the ceramic substrate is an alumina sintered body.

8. An electrostatic chuck, comprising:
    a dielectric ceramic layer made of an alumina sintered body having a volume resistivity equal to or greater than about $1\times10^{17}\Omega\cdot cm$ at room temperature and a volume resistivity equal to or greater than about $1\times10^{15}\Omega\cdot cm$ at 200° C.; and
    an electrode formed on one surface of the dielectric ceramic layer.

9. The electrostatic chuck, according to claim 8, wherein the alumina sintered body has a purity equal to or greater than about 99.5% by weight, and a density in a range from about 3.80 to about 4.00 g/cm³.

10. The electrostatic chuck, according to claim 8, wherein the alumina sintered body is sintered in an inert atmosphere or a reduction atmosphere by hot press method.

11. The electrostatic chuck, according to claim 8, wherein the dielectric ceramic layer has a thickness in a range from about 0.05 mm to about 0.50 mm.

12. The electrostatic chuck, according to claim 8, further comprising:
    a ceramic substrate joined to the dielectric ceramic layer via the electrode;
    wherein the dielectric ceramic layer, the electrode, and the ceramic substrate are an integrated body by hot press method.

13. The electrostatic chuck, according to claim 12, wherein the ceramic substrate is an alumina sintered body.

14. The electrostatic chuck according to claim 8, wherein the dielectric ceramic layer consists essentially of alumina.

15. The electrostatic chuck according to claim 8, wherein the alumina sintered body of the dielectric ceramic layer is a twice-sintered alumina body.

16. The electrostatic chuck according to claim 15, wherein the alumina sintered body of the dielectric ceramic layer is sintered by a hot press method at least as a second sintering step to form the twice-sintered alumina body.

17. An alumina sintered member having a volume resistivity equal to or greater than about $1\times10^{17}\Omega\cdot cm$ at room temperature and a volume resistivity equal to or greater than about $1\times10^{14}\Omega\cdot cm$ at 300° C.

18. The alumina sintered member, according to claim 17, wherein the alumina sintered member has a volume resistivity equal to or greater than about $1\times10^{14}\Omega\cdot cm$ at 400° C.

19. The alumina sintered member, according to claim 17, wherein the alumina sintered member has a purity equal to or greater than about 99.5% by weight, and a density in a range from about 3.80 to about 4.00 g/cm³.

20. The alumina sintered member, according to claim 17, wherein the alumina sintered member is sintered in an inert atmosphere or a reduction atmosphere by hot press method.

21. A manufacturing method for an alumina sintered member, comprising:
    forming an alumina sintered member having a volume resistivity equal to or greater than about $1\times10^{17}\Omega\cdot cm$ at room temperature and a volume resistivity equal to or greater than about $1\times10^{14}\Omega\cdot cm$ at 300° C. by sintering with ceramic raw material powder including at least about 99.5% by weight alumina in an inert atmosphere or a reduction atmosphere by hot press method.

22. A manufacturing method for an alumina sintered member, comprising:
    forming an alumina sintered member having a volume resistivity equal to or greater than about $1\times10^{17}\Omega\cdot cm$ at room temperature and a volume resistivity equal to or greater than about $1\times10^{15}\Omega\cdot cm$ at 200° C. by sintering with ceramic raw material powder including at least about 99.5% by weight alumina in an inert atmosphere or a reduction atmosphere by hot press method.

* * * * *